United States Patent
Bandyopadhyay et al.

(10) Patent No.: US 9,773,807 B1
(45) Date of Patent: Sep. 26, 2017

(54) CONDUCTIVE COMPONENTS AND MEMORY ASSEMBLIES

(71) Applicant: Micron Technology, Inc., Boise, ID (US)

(72) Inventors: Sudip Bandyopadhyay, Singapore (SG); Keen Wah Chow, Singapore (SG); Devesh Kumar Datta, Singapore (SG); Anurag Jindal, Singapore (SG); David Ross Economy, Boise, ID (US); John Mark Meldrim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/455,859

(22) Filed: Mar. 10, 2017

(51) Int. Cl.
　　*H01L 27/115* (2017.01)
　　*H01L 27/11582* (2017.01)
　　*H01L 27/11556* (2017.01)
　　*H01L 23/528* (2006.01)
　　*H01L 23/532* (2006.01)

(52) U.S. Cl.
　　CPC ...... *H01L 27/11582* (2013.01); *H01L 23/528* (2013.01); *H01L 23/53266* (2013.01); *H01L 27/11556* (2013.01)

(58) Field of Classification Search
　　CPC ......... H01L 27/11582; H01L 23/53266; H01L 27/11556; H01L 23/528
　　See application file for complete search history.

(56) References Cited

U.S. PATENT DOCUMENTS

| | | | | |
|---|---|---|---|---|
| 8,853,769 | B2 * | 10/2014 | Thimmegowda | H01L 29/78 257/325 |
| 2012/0091418 | A1 * | 4/2012 | Chen | H01L 45/08 257/4 |
| 2016/0204111 | A1 * | 7/2016 | Park | H01L 23/3171 257/324 |

* cited by examiner

*Primary Examiner* — William Coleman
(74) *Attorney, Agent, or Firm* — Wells St. John P.S.

(57) ABSTRACT

Some embodiments include a memory assembly having memory cells proximate a conductive source. Channel material extends along the memory cells and is electrically coupled with the conductive source. The conductive source is over an insulative material and includes an adhesion material directly against the insulative material. The adhesion material comprises one or more of metal, silicon nitride, silicon oxynitride, silicon carbide, metal silicide, metal carbide, metal oxide, metal oxynitride and metal nitride. The conductive source includes metal-containing material over and directly against the adhesion material. The metal-containing material consists essentially of metal. The conductive source includes a metal-and-nitrogen-containing material over and directly against the metal-containing material, and includes a conductively-doped semiconductor material over the metal-and-nitrogen-containing material.

26 Claims, 4 Drawing Sheets

CONDUCTIVE COMPONENTS AND MEMORY ASSEMBLIES

TECHNICAL FIELD

Conductive components and memory assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory. A NAND cell unit comprises at least one selecting device coupled in series to a serial combination of memory cells (with the serial combination commonly being referred to as a NAND string). NAND architecture may be configured to comprise vertically-stacked memory cells, and channel material along the memory cells. The channel material is electrically coupled with a conductive source line. Resistance along the source line may be problematic, and accordingly it would be desirable to develop source line configurations having reduced resistance as compared to conventional configurations. It may also be desirable to utilize such reduced-resistance configurations in other electrical components and structures in addition to, or alternatively to, utilizing the reduced resistance configurations as source lines of NAND memory.

DETAILED DESCRIPTION OF THE ILLUSTRATED EMBODIMENTS

Some embodiments include source line configurations in which multiple metal-containing materials are stacked one atop another. Such source line configurations may have reduced resistance as compared to conventional source line configurations, which may enable improved performance across NAND memory arrays. Although some embodiments were motivated by a desire to reduce resistance along source lines, it is to be understood that the configurations described herein comprising stacked metal-containing materials may have general application for incorporation within integrated components and structures having high conductivity (i.e., low resistance). Although example configurations described herein pertain to source "lines", it is to be understood that the source may have any suitable configuration (e.g., plate, plug, slot, region, etc.). Accordingly, the term "source" may be utilized in the claims that follow, with such term being generic to source lines, plates, plugs, etc., and any other configurations of the source either now known or yet to be developed.

Figure 1:
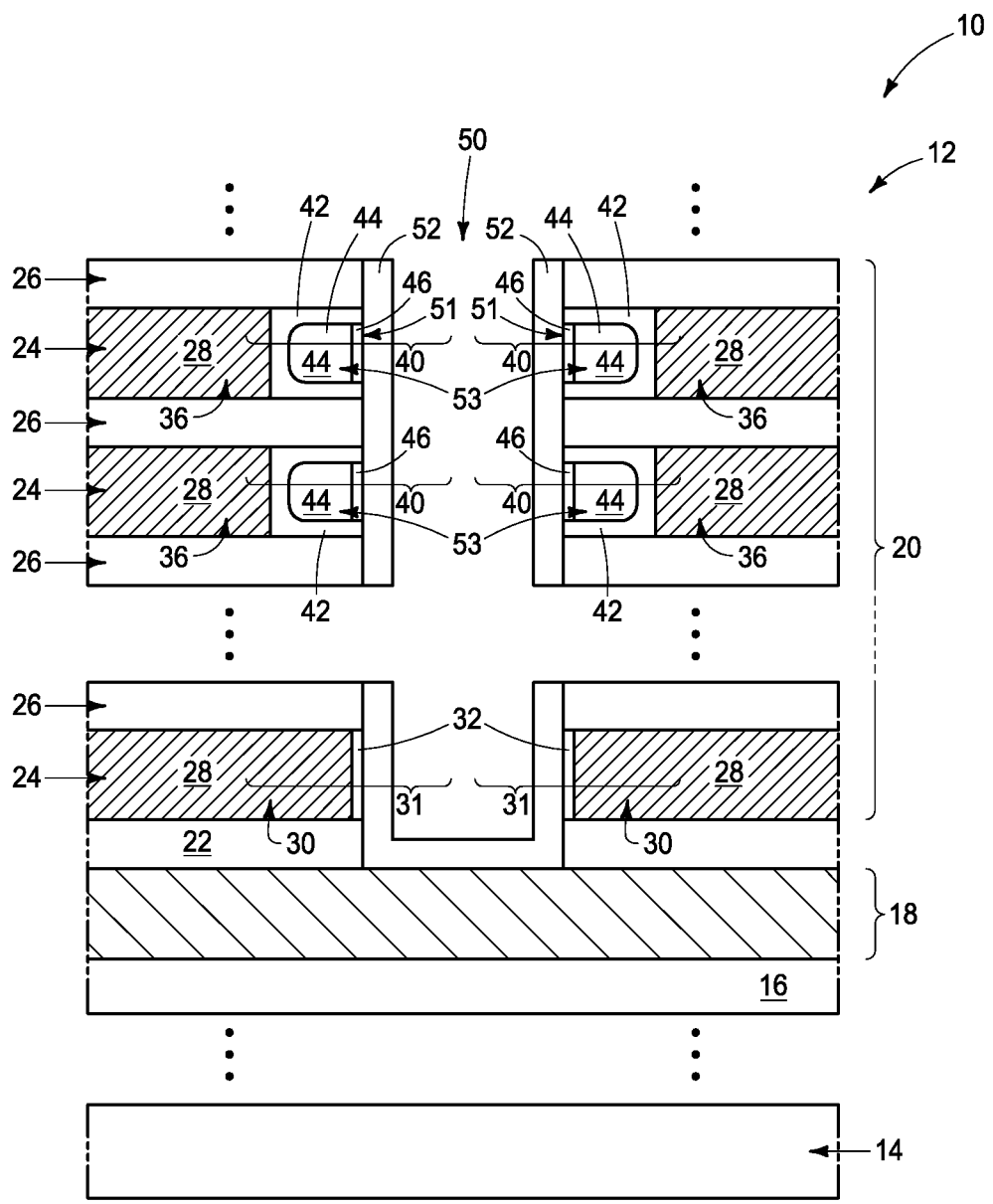
FIG. 1 is a diagrammatic cross-sectional view of a region of an example memory assembly.

Referring to FIG. 1, such illustrates a portion of an integrated structure 10 comprising a NAND memory array. In some embodiments, the illustrated portion of the integrated structure 10 may be considered to comprise a region of a memory assembly 12.

The memory assembly 12 is supported by a base 14. The base 14 may comprise semiconductor material; and may, for example, comprise, consist essentially of, or consist of monocrystalline silicon. The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 14 may correspond to a semiconductor substrate containing one or more materials associated with integrated circuit fabrication. Such materials may include, for example, one or more of refractory metal materials, barrier materials, diffusion materials, insulator materials, etc. In some applications, the base may include, CMOS, insulation, wiring, etc.

The memory assembly 12 includes a source line 18 over an insulative material 16.

The insulative material 16 may comprise any suitable composition or combination of compositions; including, for example, one or more of silicon dioxide, silicon nitride, etc.

The source line 18 is electrically conductive, and may comprise a stack of conductive materials; as described in more detail below with reference to FIGS. 2-6. An uppermost conductive material of the source line 18 may be conductively-doped semiconductor material (for instance, conductively-doped silicon); with such conductively-doped semiconductor material having a dopant concentration of at least about $10^{20}$ atoms/cm$^3$. The dopant may be n-type or p-type.

A gap is provided between insulative material 16 and base 14 to indicate that there may be other materials and/or components provided between the insulative material 16 and the base 14. In some embodiments, the insulative material 16 may be directly against the base 14. In some embodiments, components and/or structures within the gap may include, for example, CMOS, wiring, isolation, etc.

An insulative material 22 is over the source line 18. The insulative material 22 may comprise any suitable composition or combination of compositions; and in some embodiments may comprise, consist essentially of, or consist of one or more of aluminum oxide, hafnium oxide, zirconium oxide, silicon dioxide, silicon nitride, aluminum nitride, etc.

A stack 20 of alternating conductive levels 24 and insulative levels 26 is supported by the insulative material 22. A gap is provided within the illustrated stack 20 to indicate that the stack may include more than the illustrated number of conductive levels and insulative levels. The insulative levels 26 and conductive levels 24 may have any suitable thicknesses; and may, for example, have thicknesses within a range of from about 100 angstroms (Å) to about 3000 Å. In some applications, the insulative levels 26 may be thinner than the conductive levels 24. For instance, the insulative levels 26 may be about 200 Å thick and the conductive levels 24 may be about 300 Å thick.

The insulative levels 26 may comprise any suitable insulative composition or combination of insulative compositions; and in some embodiments may comprise silicon dioxide.

The conductive levels 24 comprise conductive material 28. Such conductive material may include any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The lower conductive level is part of a source-side select gate (SGS gate) 30. The SGS gate includes a dielectric material 32 along the conductive material 28. The SGS gate 30 is part of an SGS device 31 (which is diagrammatically illustrated with brackets). Although it appears that there are two SGS devices 31 in the cross-sectional view of FIG. 1, with each device being on a separate side of an opening 50 extending through the lower conductive layer 24; in practice the conductive layer 24 may extend entirely around the opening 50 and the illustrated devices 31 may be comprised by a single SGS device that extends entirely around the opening 50.

The conductive material 28 of the upper conductive levels 24 includes control gates 36 of memory cells 40 (with approximate locations of the memory cells 40 being diagrammatically illustrated with brackets). Each memory cell 40 may extend entirely around opening 50 so that horizontally adjacent memory cells in the cross-sectional view of FIG. 1 are actually part of the same memory cell.

In some applications, the number of memory cells in each NAND string is determined by the number of control gate levels in stack 20. The stack may comprise any suitable number of control gate levels. For instance, the stack 20 may have 8 control gate levels, 16 control gate levels, 32 control gate levels, 64 control gate levels, 128 control gate levels, etc.

The memory cells 40 include charge-blocking material 42, charge-storage material 44, and gate dielectric material 46.

The charge-blocking material 42 may comprise any suitable composition or combination of compositions; and in some embodiments may comprise a laminate stack of silicon dioxide, silicon nitride and silicon dioxide.

The charge-storage material 44 may comprise any suitable composition or combination of compositions; and in some embodiments may comprise floating gate material (for instance, doped or undoped silicon) or charge-trapping material (for instance, silicon nitride, metal dots, etc.).

The gate-dielectric material 46 may comprise any suitable composition or combination of compositions; and in some embodiments may comprise silicon dioxide. The gate dielectric material 46 may function as a material through which charge carriers tunnel or otherwise pass during programming operations, erasing operations, etc. In some contexts, the gate-dielectric material may be referred to simply as an insulative material or a dielectric material. The dielectric material 32 of the SGS device 31 may be the same composition as the dielectric material 46, or may be a different composition relative to the dielectric material 46.

The opening 50 extends through stack 20, through insulative material 22, and to an upper surface of conductive source line 18, with such opening having sidewalls 51 along the levels 24 and 26 of stack 20. The opening 50 may have a continuous shape when viewed from above; and may be, for example, circular, elliptical, etc. Accordingly, the sidewalls 51 of FIG. 1 may be comprised by a continuous sidewall that extends around the periphery of opening 50.

Channel material 52 extends along the sidewalls 51 of the opening 50, and along a bottom of the opening 50. The channel material may comprise any suitable composition, and some embodiments may comprise appropriately-doped semiconductor material (for instance, appropriately-doped silicon, appropriately-doped germanium, etc.).

In the shown embodiment, the channel material 52 directly contacts the upper surface of the source line 18. In other embodiments, the channel material may be electrically coupled with an upper surface of source line 18 through an intervening conductive material.

In some embodiments, the channel material 52 and the upper surface of source line 18 may both comprise the same semiconductor material (for instance, silicon). Conductivity-enhancing dopant from an upper region of the source line 18 may be diffused into the lower region of channel material 50 with appropriate thermal processing to provide desired dopant within a region of the channel material 52 along the SGS device 31.

The illustrated configuration has the blocking material 42, charge-storage material 44, and dielectric material 46 extending into cavities 53 relative to each of the conductive levels 24. In other embodiments, the charge-blocking material 42, charge-storage material 44 and dielectric material 46 may line the sidewalls 51 of the opening 50.

In some embodiments, the memory cells 40 may be considered to be vertically-stacked memory cells of a NAND memory array. In other embodiments, the memory cells 40 may have other configurations. The memory cells 40 may be considered to be proximate the conductive source line 18 and vertically-stacked over the conductive source line 18. In other embodiments, the memory cells 40 may be proximate the conductive source line 18 without being vertically stacked over the conductive source line.

Some embodiments pertain to the configuration of the source line 18.

Figure 2:
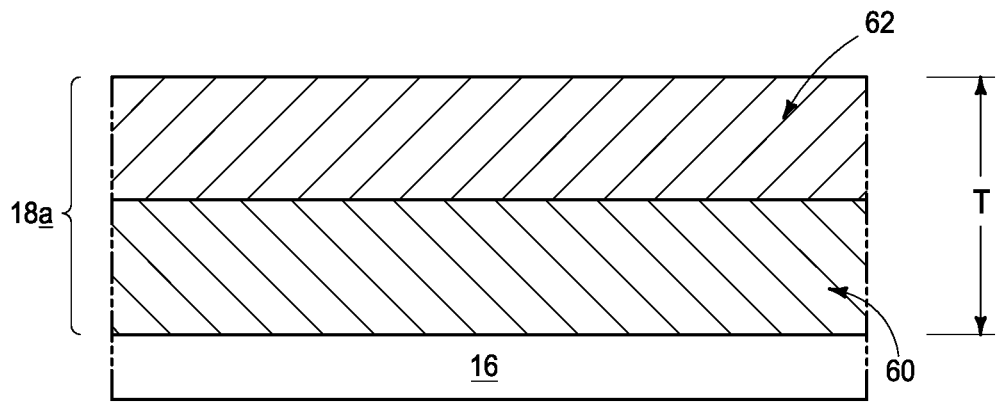
FIG. 2 is a diagrammatic cross-sectional view of a region of a prior art source line.

FIG. 2 shows a source line 18a having a prior art configuration. Such prior art configuration comprises a lower region 60 comprising, consisting essentially of, or consisting of tungsten silicide; and an upper region 62 comprising, consisting essentially of, or consisting of conductively-doped silicon. The source line 18a may have an overall thickness, T, of at least about 4000 Å. The relative thicknesses of the upper and lower regions may be about the same as one another (as shown), or may be substantially different from one another. A problem encountered in utilizing the prior art configuration 18a is that the resistance through such configuration becomes unacceptably high for increasing levels of integration, and such resistance may become even higher if the configuration 18a is thinned to less than 4000 Å. Accordingly, it is desired to develop new source line configurations having reduced resistance as compared to the prior art configuration 18a, while preferably keeping an overall thickness less than or equal to about 4000 Å.

Figure 3:
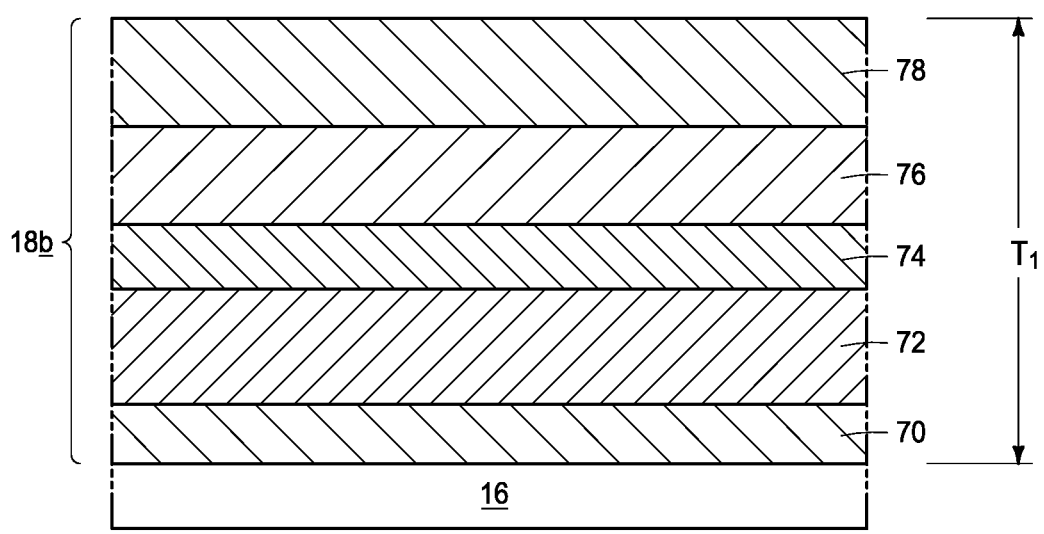
FIGS. 3-6 are diagrammatic cross-sectional views of regions of example source lines.

FIG. 3 illustrates an example conductive source line 18b which may be utilized in some embodiments. The conductive source line 18b includes an adhesion material 70, a first metal-containing material 72 over the adhesion material, a second metal-containing material 74 over the first metal-containing material, a third metal-containing material 76 over the second metal-containing material, and a conductively-doped semiconductor material 78 over the third metal-containing material (with the semiconductor material 78 of FIG. 3 being the same as the semiconductor material within the upper region 62 of the prior art structure of FIG. 2 in some embodiments).

The adhesion material 70 is utilized for creating a robust interface between insulative material 16 and the first metal-containing material 72. The adhesion material 70 may be conductive (as shown) or insulative, and may comprise any suitable composition or combination of compositions. The adhesion material 70 is shown to be conductive and part of the conductive source line 18a. If the adhesion material 70 is insulative, such may be considered to be part of the underlying insulative base 16 rather than part of the conductive source line 18a.

In some embodiments, the adhesion material 70 may comprise one or more of metal, silicon nitride, silicon oxynitride, silicon carbide, metal silicide, metal carbide, metal oxide, metal oxynitride and metal nitride. For instance, the adhesion material may comprise one or more of W, Ta, Ti, WSi, TaSi, TiSi, WN, TaN, TiN, WO, TaO, TiO, WC, TaC, TiC, WON, TaON, TiON, SiN, SiON, SiC, etc.; where the formulas indicate primary chemical constituents rather than specific stoichiometries. The adhesion material 70 preferably forms a continuous layer across insulative material 16. The adhesion material 70 may be formed to any suitable thickness, including, for example, a thickness of from about one monolayer to about 200 Å. The adhesion material 70 is directly against an upper surface of insulative material 16 in the shown embodiment.

The first metal-containing material 72 may comprise any suitable composition or combination of compositions. In some embodiments, the first metal-containing material consists essentially of, or consists of metal having high conductivity; such as, for example, one or more of tungsten, tantalum and ruthenium. The first metal-containing material 72 may be formed to any suitable thickness, such as, for example, a thickness within a range of from about 50 Å to about 1000 Å. The first metal-containing material 72 is directly against the adhesion material 70 in the shown embodiment.

The second metal-containing material 74 may be utilized as a barrier to preclude semiconductor migration (e.g., silicon migration) from semiconductor-containing materials along the top of structure 18b (e.g., conductively-doped semiconductor 78 and/or a metal silicide of material 76) into the first metal-containing material 72. If silicon (or other semiconductor) migrates into the first metal-containing material 72, such may form metal silicide from the metal of the metal-containing material 72 and thereby undesirably increase resistance within the first metal-containing material 72. In some embodiments, the second metal-containing material 74 may be referred to as a semiconductor-migration-barrier material, or as a silicon-migration-barrier material.

The second metal-containing material 74 may comprise any suitable composition or combination of compositions; and in some embodiments may comprise metal and nitrogen. For instance, the second metal-containing material 74 may comprise one or more of TiN, WN, TaN, etc.; where the formulas indicate primary chemical constituents rather than specific stoichiometries. In some embodiments, the second metal-containing material 74 may comprise silicon in addition to the metal and nitrogen; and may, for example, comprise one or more of TiSiN, TaSiN, WSiN, etc. (where the formulas indicate primary chemical constituents rather than specific stoichiometries).

In the shown embodiment, the second metal-containing material 74 is directly against the first metal-containing material 72. The first and second metal-containing materials 72 and 74 may comprise a metal in common (for instance, both of the materials 72 and 74 may comprise one or both of tungsten and tantalum), or may comprise no metal in common.

The second metal-containing material 72 may comprise any suitable thickness, and in some embodiments may have a thickness within a range of from about 5 Å to about 400 Å.

Figure 4:
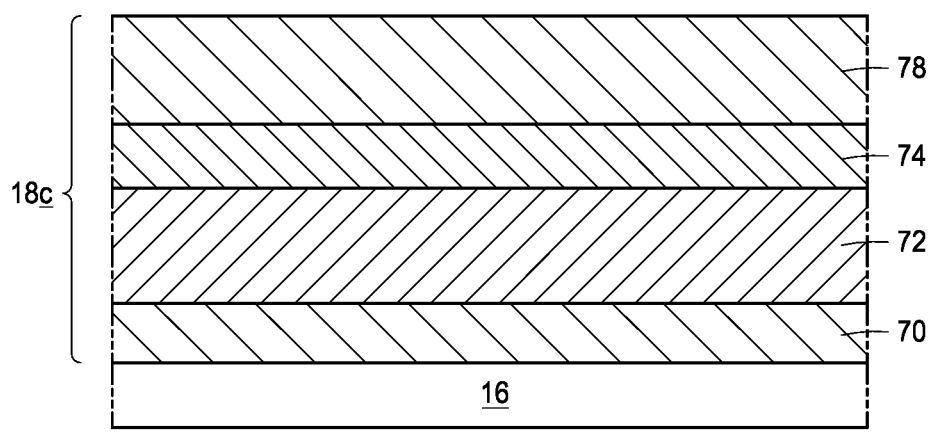

The third metal-containing material 76 is an optional material, and may be omitted in embodiments in which it is found acceptable to form conductively-doped semiconductor material 78 directly against the second metal-containing material 74 (as shown in FIG. 4 relative to a source line configuration 18c). If the third metal-containing material 76 is utilized, such material may comprise a metal silicide and/or a metal nitride; such as, for example, tungsten silicide, tungsten nitride, etc. The third metal-containing material 76 may have a thickness of less than or equal to about 2000 Å, and in the shown embodiment is formed directly against an upper surface of the second metal-containing material 74.

The conductively-doped semiconductor material 78 is formed directly against an upper surface of the third metal-containing material 76 in the embodiment of FIG. 3, but may be formed directly against the upper surface of the second metal-containing material 74 in other embodiments in which the third metal-containing material 76 is omitted (as shown in FIG. 4). The conductively-doped semiconductor material 78 may comprise any suitable conductively-doped semiconductor material, including, for example, conductively-doped germanium, conductively-doped silicon, etc. In some embodiments, the conductively-doped semiconductor material 78 may comprise, consist essentially of, or consist of silicon doped to a concentration of at least about $10^{20}$ atoms/cm$^3$ with conductivity-enhancing dopant (e.g., phosphorus, boron, etc.). The conductively-doped semiconductor material 78 may be formed to any suitable thickness; including, for example, a thickness within a range of from about 100 Å to about 2000 Å.

In some embodiments, the materials 76 and 78 may be referred to as first and second silicon-containing conductive materials, respectively; and may be representative of one or more silicon-containing conductive materials that may be formed over the barrier material 74 in example embodiments.

The source line configuration 18b of FIG. 3 may have a higher conductivity (lower resistance) than the prior art source line configuration 18a of FIG. 2, while having a thickness ($T_1$) of less than or equal to 4000 Å. In some embodiments, the combined thickness $T_1$ of the various materials 70, 72, 74, 76 and 78 may be within a range of from about 200 Å to about 6000 Å. In applications in which the materials 70, 72, 74, 76 and 78 are configured as source lines which are to be incorporated into highly-integrated circuitry, it may be desired that the thickness $T_1$ be on the lower end of the indicated range; and specifically, within a range of from about 200 Å to less than or equal to about 4000 Å. In embodiments in which the materials 70, 72, 74, 76 and 78 are configured into other types of components or structures besides conductive source lines, the thickness $T_1$ may be less stringent; and it may be acceptable for the thickness $T_1$ to extend to the upper end of the range (i.e., to extend to about 6000 Å), or even greater.

Each of the materials 70, 72, 74, 76 and 78 is shown to be substantially homogeneous throughout its entire thickness. In other embodiments, one or more of such materials may comprise a laminate of two or more discrete compositions; and/or may comprise a compositional gradient. Also, in some embodiments additional materials may be introduced into a source line configuration. For instance, the illustrated metal-containing material 72 may be a laminate comprising a second composition comprising, consisting essentially of, or consisting of Ti; over a first composition comprising, consisting essentially of, or consisting of W. As another example, the illustrated metal-containing material 74 may be a laminate comprising a second composition comprising, consisting essentially of, or consisting of TiN; over a first composition comprising, consisting essentially of, or consisting of WN.

In some example embodiments, the barrier material 74 may be subdivided amongst two or more different compositions; and each composition may be considered to be a different barrier material. For instance, FIG. 5 shows a source line configuration 18d having two semiconductor-migration-barrier materials 74a and 74b.

Figure 5:
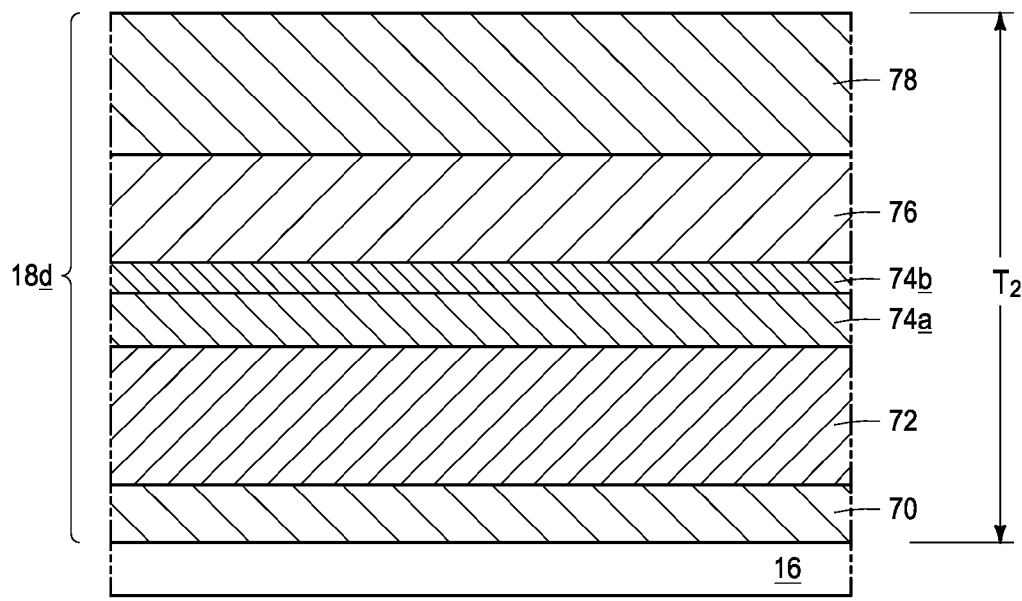

In some embodiments, the configuration 18d of FIG. 5 may be considered to comprise the adhesion material 70 and the first metal-containing material 72 described above with reference to FIG. 3. The configuration comprises a second metal-containing material 74a which may include any of the compositions described above relative to the material 74 of FIG. 3; and in some embodiments may include metal and nitrogen (for instance, may comprise, consist essentially of, or consist of tungsten and nitrogen). The second metal-containing material 74a may have a thickness within a range of from about 5 Å to about 400 Å. The configuration 18d includes a third metal-containing material 74b, with such third metal-containing material comprising any of the compositions described above relative to the material 74 of FIG. 3; and in some embodiments including metal, nitrogen and silicon (for instance, comprising, consisting essentially of, or consisting of tungsten, nitrogen and silicon). The third metal-containing material 74b may have a thickness within a range of from about 5 Å to about 400 Å.

The configuration 18d includes materials 76 and 78 over the third metal-containing material 74b. In some embodiments, the material 76 may be referred to as a fourth metal-containing material. In some embodiments, the material 76 may be omitted to form a construction analogous to that of FIG. 4, but including materials 74a and 74b in place of the material 74 of FIG. 4.

The source line configuration 18d comprises a thickness $T_2$. Such thickness may be about the same as the thickness $T_1$ discussed above with reference to FIG. 3, and in some embodiments may be within a range of from about 400 Å to about 6000 Å.

Figure 6:
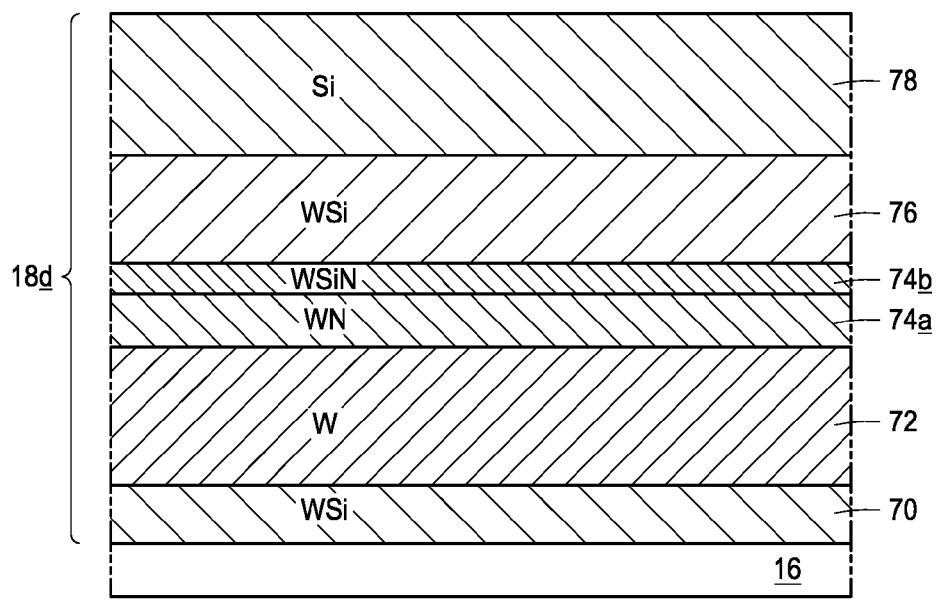

FIG. 6 shows a specific example of the source line configuration 18d. Such example includes an adhesion material 70 comprising, consisting essentially of, or consisting of WSi; a first metal-containing material 72 comprising, consisting essentially of, or consisting of W; a second metal-containing material 74a comprising, consisting essentially of, or consisting of WN; a third metal-containing material 74b comprising, consisting essentially of, or consisting of WSiN; a fourth metal-containing material 76 comprising, consisting essentially of, or consisting of WSi; and the semiconductor material 78 comprising, consisting essentially of, or consisting of conductively-doped silicon (where the formulas indicate primary constituents, rather than specific stoichiometries).

In some embodiments, there may be a minor amount of semiconductor (e.g., silicon) migration through a barrier material (e.g., material 74 in the embodiments described above), due to, for example, localized regions of failure of the barrier material. In such embodiments, the metal-containing material 72 may have local regions containing semiconductor (e.g., silicon), and associated high resistance. However, the majority of the metal-containing material 72 may remain substantially free of semiconductor (e.g., silicon), and may therefore have desired low resistance. In some embodiments, local regions of metal-containing material 72 with high resistance will not be problematic provided that enough of the metal-containing material 72 has low resistance to provide a conductive path along the source line having conductance within desired tolerances. In such embodiments, the metal-containing material 72 may be considered to "consist essentially of" metal, provided that it has a conductive path with conductance about the same as pure metal (with the term "about the same" meaning the same to within reasonable tolerances of fabrication and measurement).

In some embodiments, the configuration 18d of FIGS. 5 and 6 may be considered to comprise a second metal-containing material 74a having a metal in common with the first metal-containing material 72 (e.g., tungsten in the embodiment of FIG. 6). The third metal-containing material 74b also has a metal in common with the second metal-containing material 74a (e.g., tungsten in the embodiment of FIG. 6); and like the second metal-containing material 74a includes nitrogen in addition to the metal. However, the third metal-containing material 74b is compositionally different than the second metal-containing material 74a. In the embodiment of FIG. 6, such compositional difference includes incorporation of silicon within the third metal-containing material 74b (i.e., includes a difference in silicon concentration between the second and third metal-containing materials 74a and 74b; with the second metal-containing material having no measurable silicon and the third metal-containing material having some measurable silicon). In other embodiments, the compositional difference between the second and third metal-containing materials 74a and 74b may be due to a different in nitrogen concentration within the third metal-containing material 74b as compared to the second metal-containing material 74a in addition to, or alternatively to, a difference in silicon concentration between the second and third metal-containing materials 74a and 74b. For instance, in some embodiments the third metal-containing material 74b may have a higher atomic percentage of nitrogen than the second metal-containing material 74a.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure.

The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory assembly having memory cells proximate a conductive source. Channel material extends along the memory cells and is electrically coupled with the conductive source. The conductive source is over an insulative material and includes an adhesion material directly against the insulative material. The adhesion material comprises one or more of metal, silicon nitride, silicon oxynitride, silicon carbide, metal silicide, metal carbide, metal oxide, metal oxynitride and metal nitride. The conductive source includes first metal-containing material over and directly against the adhesion material. The first metal-containing material consists essentially of metal. The conductive source includes a second metal-containing material over and directly against the first metal-containing material. The second metal-containing material comprises metal and nitrogen. A conductively-doped semiconductor material is over the second metal-containing material.

Some embodiments include a NAND memory assembly having a conductive source, and having vertically-stacked memory cells over the conductive source. Channel material extends along the vertically-stacked memory cells and is electrically coupled with the conductive source. The conductive source includes a first metal-containing material which consists essentially of metal; a second metal-containing material over the first metal-containing material and which comprises metal and nitrogen; and a conductively-doped semiconductor material over the second metal-containing material.

Some embodiments include a conductive component which has a first metal-containing material which consists essentially of metal and which includes one or more of tungsten, tantalum and ruthenium. A second metal-containing material is over the first metal-containing material. The second metal-containing material includes a common metal as the first metal-containing material, and in addition includes nitrogen. A third metal-containing material is over the second metal-containing material. The third metal-containing material includes metal and nitrogen, and is compositionally different from the second metal-containing material. One or more silicon-containing conductive materials are over the third metal-containing material.

Some embodiments include a conductive component over an insulative material. The conductive component may include an adhesion material directly against the insulative material. The adhesion material may include metal and/or semiconductor; and may have a thickness of from one monolayer to less than or equal to about 200 angstroms. The metal may include, for example, one or both of titanium and tungsten; and the semiconductor may include, for example, silicon (e.g., may be conductively-doped silicon). The conductive component may include a metal-containing material and/or semiconductor over the adhesion material. The metal-containing material may include, for example, one or more of tungsten, tantalum and ruthenium; and the semiconductor may include, for example, silicon (e.g., may be conductively-doped silicon). The conductive component may have a thickness within a range of from about 50 angstroms to about 1000 angstroms. The conductive component may include a silicon-migration-barrier material over the metal-containing material. The silicon-migration-barrier material may, for example, comprise metal and nitrogen. The silicon-migration-barrier material may have a thickness within a range of from about 5 angstroms to about 400 angstroms. The conductive component may include one or more silicon-containing conductive materials over the silicon-migration-barrier material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory assembly, comprising:
   memory cells proximate a conductive source;
   channel material extending along the memory cells and being electrically coupled with the conductive source; and
   wherein the conductive source is over an insulative material and includes:
      an adhesion material directly against the insulative material; the adhesion material comprising one or more of metal, silicon nitride, silicon oxynitride, silicon carbide, metal silicide, metal carbide, metal oxide, metal oxynitride and metal nitride;
      a first metal-containing material over and directly against the adhesion material; the first metal-containing material consisting essentially of metal;
      a second metal-containing material over and directly against the first metal-containing material; the second metal-containing material comprising metal and nitrogen; and
      a conductively-doped semiconductor material over the second metal-containing material.

2. The memory assembly of claim 1 wherein the first and second metal-containing materials comprise one or both of tungsten and tantalum.

3. The memory assembly of claim 1 wherein the second metal-containing material comprises one or more of TiSiN, TaSiN and WSiN, where the formulas indicate primary constituents rather than specific stoichiometries.

4. The memory assembly of claim 1 wherein the conductively-doped semiconductor material is directly against the second metal-containing material.

5. The memory assembly of claim 1 including a third metal-containing material between the conductively-doped semiconductor material and the second metal-containing material; the third metal-containing material including metal and one or both of silicon and nitrogen.

6. The memory assembly of claim 5 including a fourth metal-containing material between the conductively-doped semiconductor material and the third metal-containing material; the fourth metal-containing material including metal silicide.

7. The memory assembly of claim 6 wherein:
the adhesion material comprises tungsten silicide;
the first metal-containing material consists essentially of tungsten;
the second metal-containing material comprises tungsten and nitrogen;
the third metal-containing material comprises tungsten, nitrogen and silicon;
the fourth metal-containing material comprises tungsten silicide; and
the conductively-doped semiconductor material comprises conductively-doped silicon.

8. A NAND memory assembly, comprising:
a conductive source;
vertically-stacked memory cells over the conductive source;
channel material extending along the vertically-stacked memory cells and being electrically coupled with the conductive source; and
wherein the conductive source includes:
 a first metal-containing material; the first metal-containing material consisting essentially of metal;
 a second metal-containing material over the first metal-containing material; the second metal-containing material comprising metal and nitrogen; and
 a conductively-doped semiconductor material over the second metal-containing material.

9. The NAND memory assembly of claim 8 wherein the first metal-containing material comprises one or more of tungsten, tantalum and ruthenium.

10. The NAND memory assembly of claim 8 wherein the second metal-containing material comprises one or more of titanium, tungsten and tantalum.

11. The NAND memory assembly of claim 8 wherein the second metal-containing material includes silicon.

12. The NAND memory assembly of claim 8 wherein the second metal-containing material comprises one or more of TiSiN, TaSiN and WSiN, where the formulas indicate primary constituents rather than specific stoichiometries.

13. The NAND memory assembly of claim 8 including a third metal-containing material between the conductively-doped semiconductor material and the second metal-containing material; the third metal-containing material including metal and one or both of silicon and nitrogen.

14. The NAND memory assembly of claim 8 wherein the channel material directly contacts the conductively-doped semiconductor material.

15. The NAND memory assembly of claim 14 wherein the channel material and the conductively-doped semiconductor material both comprise silicon.

16. A conductive component, comprising:
a first metal-containing material which consists essentially of metal and which includes one or more of tungsten, tantalum and ruthenium;
a second metal-containing material over the first metal-containing material; the second metal-containing material including a common metal as the first metal-containing material, and in addition including nitrogen;
a third metal-containing material over the second metal-containing material; the third metal-containing material including metal and nitrogen, and being compositionally different from the second metal-containing material; and
one or more silicon-containing conductive materials over the third metal-containing material.

17. The conductive component of claim 16 wherein the third metal-containing material comprises a higher atomic percentage of nitrogen than the second metal-containing material.

18. The conductive component of claim 16 wherein the third metal-containing material comprises metal, silicon and nitrogen.

19. The conductive component of claim 16 wherein the third metal-containing material comprises the common metal of the first and second metal-containing materials, and in addition comprises silicon.

20. The conductive component of claim 16 wherein the first metal-containing material consists of tungsten, the second metal-containing material consists of tungsten and nitrogen, and the third metal-containing material consists of tungsten, nitrogen and silicon.

21. The conductive component of claim 16 configured as a source within a NAND memory array.

22. The conductive component of claim 16 wherein the one or more silicon-containing conductive materials include a first silicon-containing conductive material comprising tungsten silicide, and a second silicon-containing conductive material over the first silicon-containing conductive material and comprising conductively-doped silicon.

23. A conductive component over an insulative material, the conductive component comprising:
an adhesion material directly against the insulative material; the adhesion material including metal and having a thickness of from one monolayer to less than or equal to about 200 angstroms; the metal being one or both of titanium and tungsten;
a metal-containing material over the adhesion material, the metal-containing material including one or more of tungsten, tantalum and ruthenium; the metal-containing material having a thickness within a range of from about 50 angstroms to about 1000 angstroms;
a silicon-migration-barrier material over the metal-containing material; the silicon-migration-barrier material comprising metal and nitrogen; the silicon-migration-barrier material having a thickness within a range of from about 5 angstroms to about 400 angstroms; and
one or more silicon-containing conductive materials over the silicon-migration-barrier material.

24. The conductive component of claim 23 wherein the metal-containing material consists essentially of metal.

25. The conductive component of claim 23 wherein:
the adhesion material comprises tungsten silicide;
the metal-containing material consists essentially of tungsten and is a first metal-containing material;
a second metal-containing material is over the first metal-containing material, and the second metal-containing material comprises tungsten and nitrogen;
the silicon-migration-barrier material comprises tungsten, nitrogen and silicon; and
the one or more silicon-containing conductive materials include a first silicon-containing conductive material over the silicon-migration-barrier material and comprising tungsten silicide, and include a second silicon-containing conductive material over the first silicon-containing conductive material and comprising conductively-doped silicon.

26. The conductive component of claim 24 configured as a source within a NAND memory array.

* * * * *